United States Patent
Hempel et al.

(10) Patent No.: US 7,358,150 B2
(45) Date of Patent: Apr. 15, 2008

(54) TRENCH ISOLATION STRUCTURE FOR A SEMICONDUCTOR DEVICE WITH REDUCED SIDEWALL STRESS AND A METHOD OF MANUFACTURING THE SAME

(75) Inventors: Klaus Hempel, Dresden (DE); Stephan Kruegel, Reichenberg (DE); Ekkehard Pruefer, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/532,967

(22) Filed: Sep. 19, 2006

(65) Prior Publication Data

US 2007/0155120 A1    Jul. 5, 2007

(30) Foreign Application Priority Data

Dec. 30, 2005   (DE) .................... 10 2005 063 129

(51) Int. Cl.
*H01L 21/76*    (2006.01)
(52) U.S. Cl. ...................... 438/435; 438/437
(58) Field of Classification Search .............. 438/296, 438/424, 431, 435, 437, 744, 772, 774
See application file for complete search history.

(56) References Cited

U.S. PATENT DOCUMENTS

| | | | |
|---|---|---|---|
| 6,251,746 B1 * | 6/2001 | Hong et al. | 438/424 |
| 6,657,276 B1 | 12/2003 | Karlsson et al. | 257/510 |
| 7,078,314 B1 * | 7/2006 | Kim et al. | 438/427 |
| 2004/0198019 A1 * | 10/2004 | Yasui et al. | 438/435 |
| 2004/0212035 A1 | 10/2004 | Yeo et al. | 257/510 |
| 2005/0116312 A1 * | 6/2005 | Lim et al. | 257/499 |
| 2007/0155121 A1 * | 7/2007 | Frohberg et al. | 438/424 |

* cited by examiner

*Primary Examiner*—Mary Wilczewski
*Assistant Examiner*—Toniae M Thomas
(74) *Attorney, Agent, or Firm*—Williams, Morgan & Amerson, P.C.

(57) ABSTRACT

By forming a non-oxidizable liner in isolation trenches, the creation of compressive stress may be significantly reduced, wherein, in illustrative embodiments, silicon nitride may be used as liner material. For this purpose, the etch behavior of the silicon nitride may be efficiently modified on the basis of an appropriate surface treatment, thereby providing a high degree of material integrity during a subsequent etch process for removing non-modified portions of silicon nitride, which may also be used as an efficient CMP stop layer.

18 Claims, 4 Drawing Sheets

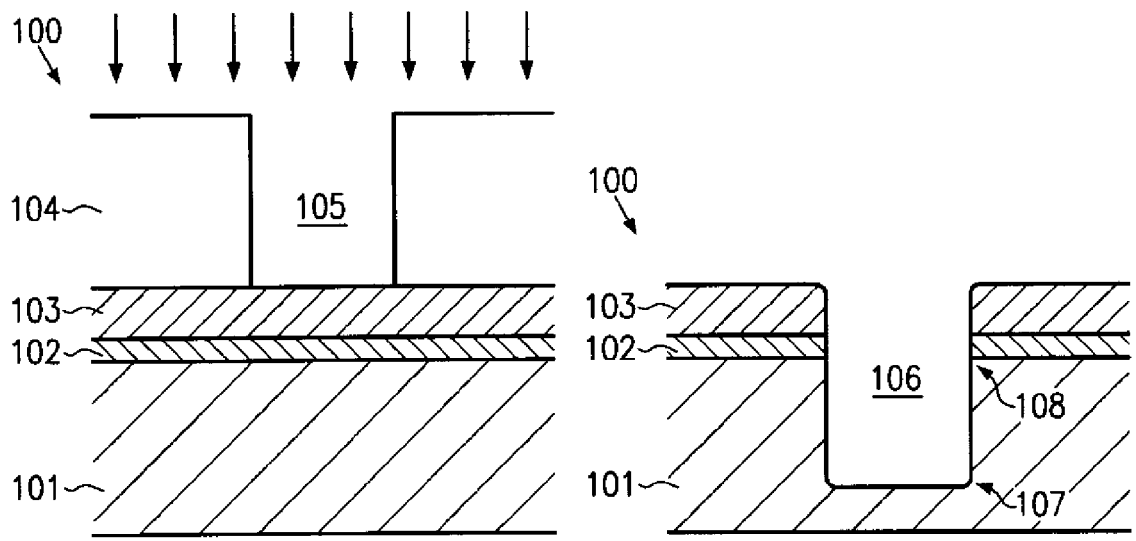
FIG.1a
(prior art)
FIG.1b
(prior art)
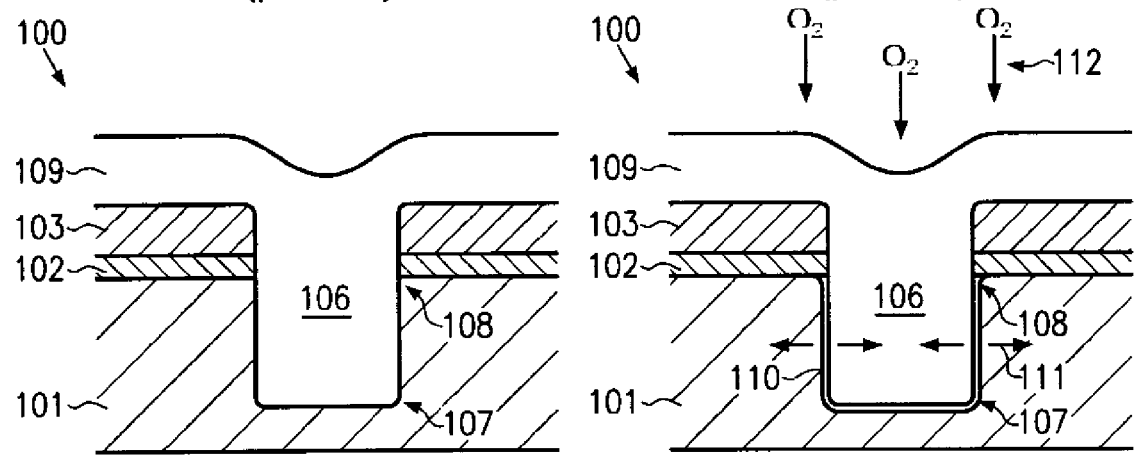
FIG.1c
(prior art)
FIG.1d
(prior art)
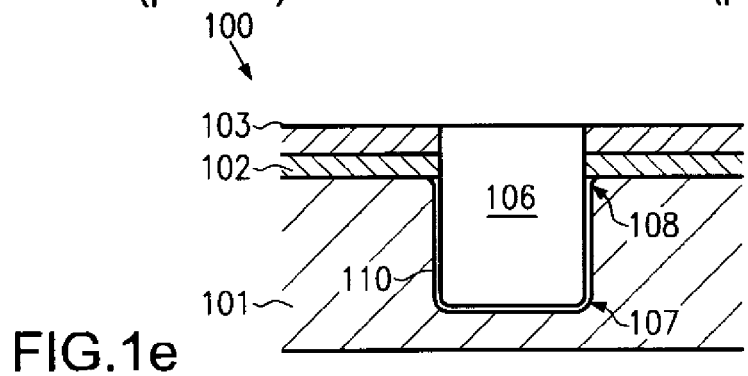
FIG.1e
(prior art)

TRENCH ISOLATION STRUCTURE FOR A SEMICONDUCTOR DEVICE WITH REDUCED SIDEWALL STRESS AND A METHOD OF MANUFACTURING THE SAME

BACKGROUND OF THE INVENTION

1. Field of the Invention

Generally, the present invention relates to the field of semiconductor device manufacturing, and, more particularly, to trench isolation structures typically employed in sophisticated semiconductor devices to electrically insulate neighboring circuit elements from each other, and more particularly to techniques for the adjustment of characteristics of trench isolation structures, such as corner rounding and residual stress created therein.

2. Description of the Related Art

The ongoing trend in continuously improving the performance of microstructures, such as integrated circuits, not only requires a steady decrease in the feature sizes of the circuit elements but also requires a structure that reliably electrically insulates adjacent circuit elements from each other, wherein the available chip area for manufacturing isolation structures decreases as the feature sizes of the circuit elements are reduced and the number thereof is increased. For integrated circuits having circuit elements with a feature size of approximately 1 μm and less, the well-established isolation structures such as the LOCOS structure (local oxidation of silicon) is preferably replaced by less space-consuming and more reliable trench isolation structures requiring the formation of a vertical trench enclosing a circuit element under consideration. In addition to the reduction of chip area occupied by the trench isolation structure compared to the LOCOS structure, the former structure provides a substantially planar surface for subsequent photolithography processes, thereby significantly improving the resolution of the photolithography process compared to the strongly varying topography of the LOCOS structure. Although the introduction of trench isolation structures into the manufacturing process of integrated circuits significantly enhances device reliability, in combination with an increased package density, certain issues arise in manufacturing trench isolation structures, especially when the dimensions of the isolation structure and the associated circuit elements approach the deep sub-micron regime. For dimensions of this order of magnitude, relatively high electrical fields may be created on sharp corners of the trench isolation structures and may therefore affect the operation of the circuit elements, such as field effect transistors, capacitors and the like, finally resulting in an increased leakage current between adjacent circuit elements.

The formation of a trench isolation structure generally requires the employment of photolithography and anisotropic etch techniques where upper corners, in particular, of the trenches exhibit, due to the anisotropic etch process, relatively sharp corners that may not be sufficiently rounded by controlling process parameters of the etch process. Therefore, it has become standard practice to form a thermally grown oxide on inner surfaces of the trench to provide an increased radius of curvature, especially of the upper corners of the isolation trenches, wherein, however, an increased thickness of the thermally grown oxide entails additional compressive stress, which in turn may adversely affect device characteristics of the adjacent circuit element.

With reference to FIGS. 1*a*-1*e*, the fabrication of a conventional isolation structure is described in more detail. In FIG. 1*a*, a semiconductor structure 100 comprises a substrate 101, for example a semiconductor substrate, such as a silicon wafer, or a dielectric substrate bearing a semiconductor layer, such as a silicon-on-insulator (SOI) substrate. An oxide layer 102 is formed over the substrate 101, for example in the form of a silicon dioxide, followed by a further dielectric layer 103, the material composition of which may be preferably selected so as to serve as a stop layer during a chemical mechanical polishing (CMP) process required in a further advanced manufacturing stage. For example, the layer 103 may be provided as a silicon nitride layer. A resist mask layer 104 is formed over the silicon nitride layer 103 having formed therein an opening 105, the dimensions of which substantially represent the dimensions of a trench to be formed in the substrate 101. It should be noted that, depending on the type of photolithography technique employed, the resist mask 104 may comprise an anti-reflective coating to enhance the resolution of the photolithography step.

A typical process flow for forming the semiconductor structure 100 may include the following processes. The oxide layer 102 may be formed by a conventional oxidation process or may be deposited by chemical vapor deposition (CVD) techniques from appropriate precursor gases. Next, the silicon nitride layer 103 is deposited, followed by applying a resist layer that is subsequently patterned by photolithography to form the opening 105. The lateral dimensions of the opening 105 may depend on the specific design of the circuit to be formed and may require advanced photolithography techniques when, for instance, feature sizes in the range of approximately 0.2 μm and less are to be manufactured.

FIG. 1*b* schematically shows the semiconductor structure 100 with a trench 106 formed in the silicon nitride layer 103, the oxide layer 102 and partially in the substrate 101. The trench 106 has bottom corners or edges 107 which exhibit a rounding or a radius of curvature that depends on the specifics of the anisotropic etch process. On an upper portion of the trench, however, the interface between the oxide layer 102, the substrate 101 and the trench 106, as indicated by 108, will form a relatively sharp corner or edge which may not be easily rounded during the etch process due to the characteristics of the anisotropic etch process. Since sharp corners, e.g., the areas 108, may entail, upon application of a voltage, relatively strong electrical fields in areas adjacent to the trench 106, respective counter-measures are usually taken to round the corners 107 and especially the areas 108 to minimize any inadvertent impact on a circuit element manufactured near the isolation trench 106, such as a field effect transistor.

Therefore, a thermal oxide liner is generally grown on inner surfaces of the trench 106 in order to especially provide a larger radius of curvature at the areas 108 at the interface between the dielectric silicon dioxide 102 and the material of the substrate 101. It turns out, however, that growing a thermal oxide within the trench 106 and subsequently depositing a bulk oxide for filling the trench 106 with a dielectric material may result in a reduced quality of the deposited oxide having a higher etch rate adjacent to the thermal liner oxide, thereby possibly leading to the creation of notches during the removal of the silicon nitride layer 103. Therefore, in some conventional approaches, a so-called "late liner" process is employed, in which the bulk oxide is deposited prior to forming the thermal oxide within the trench 106.

FIG. 1*c* schematically shows the semiconductor structure 100 with a silicon dioxide layer 109 formed over the trench 106 to an extent that the trench 106 is reliably filled at least up to the silicon nitride layer 103. Appropriate deposition techniques, such as chemical vapor deposition with precursor gases TEOS, oxygen and ozone at a temperature range of approximately 350-650° C. may be employed to fill the trench 106 substantially without the creation of any voids therein.

FIG. 1d schematically shows the semiconductor structure 100 with a thermal oxide layer 110 formed on oxidizable inner surfaces of the trench 106, wherein, particularly, the rounding at the areas 108 is significantly increased.

The thermal oxide layer 110 may be formed by exposing the substrate 101 to an oxidizing ambient 112 at an elevated temperature, wherein the dielectric oxide material of the layer 109 is simultaneously densified. By appropriately adjusting the process parameters of the oxidation process, a thickness of the thermal oxide layer 110 may be adjusted in accordance with design requirements. Although an increased thickness of the thermal oxide layer 110 is advantageous in view of increasing the rounding, i.e., the radius of curvature, of the areas 108, it turns out, however, that a mechanical stress 111 is created within the trench 106, since the volume of the thermal oxide created in the layer 110 exceeds the volume of the consumed silicon of the substrate 101. The mechanical stress 111 induced by the growth of the thermal oxide layer 110 may, however, negatively affect the device characteristics of adjacent circuit elements, for example by producing lattice damage in the crystalline structure, and may even increase when high temperature anneal cycles are carried out during the further manufacturing steps. Therefore, a trade-off has to be made regarding the required degree of rounding of the areas 108 and the amount of acceptable mechanical stress 111 created by the thermal oxide layer 110. Since a plurality of different circuit elements having a different sensitivity to undesired electric fields and compressive stress is usually manufactured in an integrated circuit, the isolation trenches 106 represent a compromise for the most sensitive type of circuit elements.

FIG. 1e schematically shows the semiconductor structure 100 after the removal of excess material of the oxide layer 109 by chemical mechanical polishing (CMP). The thickness of the silicon nitride layer 103, acting as a CMP stop layer, is also reduced during the CMP, wherein the initial thickness of the silicon nitride layer 103 is selected so as to substantially ensure the integrity of the substrate 101 across the entire substrate surface. Subsequently, the residual silicon nitride layer 103 and thereafter the oxide layer 102 may be removed by appropriate wet chemical etch processes (not shown).

In view of the situation described above, a need exists for a technique for the formation of trench isolation structures which allows a higher degree of flexibility in adapting the trench isolation to a specific circuit element.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of an isolation trench structure with reduced compressive stress while nevertheless providing a desired amount of corner rounding. In order to reduce the compressive stress typically encountered in conventional techniques for forming trench isolation structures of highly advanced semiconductor devices, the formation of a liner by thermal oxidation, for instance on the basis of a late liner approach, may be omitted and a non-oxidizable liner may be used prior to filling the trench with an insulating fill material.

According to one illustrative embodiment of the present invention, a method comprises forming a non-oxidizable layer at least on sidewalls of an isolation trench formed in a semiconductor layer that is located above a substrate. The method further comprises modifying at least a surface portion of the non-oxidizable layer and filling the isolation trench with an insulating material. Moreover, the method comprises removing excess material of the insulating material by chemical mechanical polishing and removing a non-modified portion of the non-oxidizable layer exposed by chemical mechanical polishing selectively to the modified surface portion.

According to another illustrative embodiment of the present invention, a method comprises forming a non-oxidizable layer on inner surface portions of an isolation trench formed in a semiconductor layer and filling the isolation trench with an oxide material. Moreover, a high temperature oxidation treatment is performed to selectively modify the non-oxidizable layer formed on surface portions of the isolation trench. Finally, non-modified material of the non-oxidizable layer is selectively removed by a wet chemical etch process.

According to yet another illustrative embodiment of the present invention, a semiconductor device comprises an isolation trench formed in a semiconductor layer, which has sidewalls and a bottom face. Moreover, the semiconductor device comprises a non-oxidizable insulating material that is formed on the sidewalls and on the bottom side and an insulating oxide material is formed adjacent to the non-oxidizable insulating material.

BRIEF DESCRIPTION OF THE DRAWINGS

The invention may be understood by reference to the following description taken in conjunction with the accompanying drawings, in which like reference numerals identify like elements, and in which:

FIGS. 1a-1e schematically show cross-sectional views of a semiconductor device comprising a conventional isolation trench during various manufacturing stages;

Figure 2A:
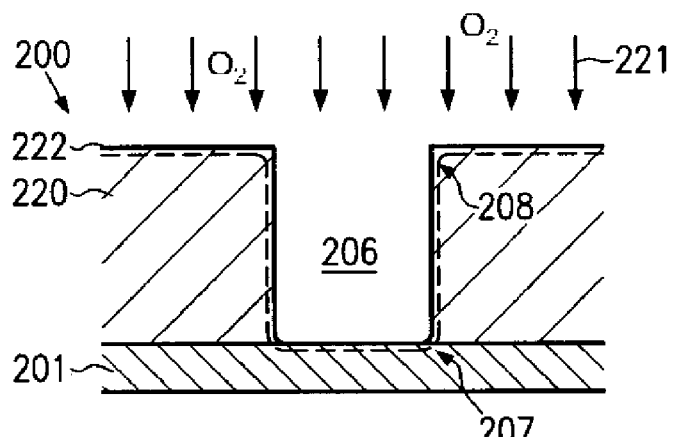
FIGS. 2a-2e schematically show cross-sectional views of a semiconductor device including an isolation trench with a reduced compressive stress due to a non-oxidizable liner formed on sidewalls of the trench according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is directed to a technique for the formation of isolation trenches in highly advanced semiconductor devices, while achieving a desired degree of corner rounding, in particular at the upper corner of the isolation trench. In accordance with one aspect of the present invention, a conventional thermally grown silicon dioxide may be omitted or removed after a desired degree of corner rounding is achieved. In illustrative embodiments, a non-oxidizable liner material may be formed at least on sidewall portions of a corresponding isolation trench, which may be formed on the basis of appropriate deposition recipes so as to reduce any compressive stress, typically provided by a conventional late liner approach.

With reference to FIGS. 2a-2e and 3a-3d, further illustrative embodiments of the present invention will now be described in more detail, wherein a non-oxidizable liner may be formed on sidewalls of the respective isolation trenches, and wherein an oxidation process is substantially avoided during the densification and other thermal heat treatments after the deposition of an insulating fill material in the trench. Consequently, undue creation of compressive stress may be significantly reduced, while achieving a desired degree of corner rounding as well as a high degree of compatibility with a conventional process flow.

FIG. 2a schematically shows a cross-sectional view of a semiconductor device 200, which may comprise a substrate 201 that may be a semiconductor substrate, such as a silicon substrate appropriate for the formation of semiconductor circuit elements thereon and therein. For this purpose, the substrate 201 may comprise a semiconductor layer 220, such as a silicon layer, a germanium layer, a gallium arsenide layer, or a layer comprising various other types of II-VI or III-V semiconductor compounds, or combinations of such materials. The substrate 201 in combination with the semiconductor layer 220 may represent any type of substrate that is appropriate for the formation of any circuit elements therein. In some illustrative embodiments, the substrate 201 in combination with the layer 220 may represent a bulk silicon substrate, while, in other illustrative embodiments, the substrate 201 in combination with the layer 220 may represent an SOI substrate, wherein the substrate 201 may be comprised of an insulating material or may have formed thereon an insulating layer on which may be formed the semiconductor layer 220. Since the vast majority of integrated circuits are currently manufactured on the basis of silicon, in the following, the substrate 201 or the semiconductor layer 220 may be referred to as silicon-based material, which forms, upon exposure to an oxidizing ambient, silicon dioxide. The semiconductor device 200 further comprises an isolation trench 206, wherein the isolation trench 206 may be formed within a portion of the layer 220 or may extend down to a buried insulating layer (not shown) when an SOI architecture is considered. The isolation trench 206 may have a depth and a lateral width that are appropriate for advanced semiconductor devices. For instance, in advanced applications, the trench width of the isolation trench 206 may be 100 nm and even less for highly sophisticated semiconductor devices including transistor elements having a gate length of 90 nm and even less. In some illustrative embodiments, the semiconductor device 200 may comprise in this manufacturing stage one or more additional layers on horizontal portions of the layer 220, as will be described in more detail with reference to FIGS. 3a-3c.

A typical process flow for forming the semiconductor device 200 as shown in FIG. 2a may comprise substantially the same processes as are previously described with reference to FIG. 1a. Thus, the isolation trench 206 may be formed within the semiconductor layer 220 on the basis of well-established photolithography and anisotropic etch techniques, wherein, as previously explained, any appropriate anti-reflective coating (ARC) layers may be provided. Moreover, prior to forming the isolation trench 206, one or more additional layers may be formed, such as a silicon dioxide layer, a silicon nitride layer and the like, as is also described with reference to FIG. 1a. Irrespective of whether or not any additional dielectric layers may have been formed prior to the patterning of the isolation trench 206, in one illustrative embodiment, after the formation of the trench 206, the semiconductor device 200 may be exposed to an oxidizing ambient 221 to form a sacrificial thermally grown oxide layer 222, which may result in an appropriate corner rounding on upper corners or edges 208 as well as on lower corners or edges 207. The thermal oxidation process 221 may be performed on the basis of well-established recipes, wherein the oxidation rate may be controlled on the basis of the temperature, the oxygen contents within the ambient 221, the pressure and the like. For example, in some illustrative embodiments, substantially the same recipe may be used as is described above for the formation of the oxide liner 102 in FIG. 1a. After the formation of the sacrificial oxide layer 222, an appropriate selective etch process may be performed to remove the layer 222, at least at sidewall portions of the isolation trench 206. For this purpose, in some illustrative embodiments, a highly selective wet chemical etch process on the basis of fluoric acid may be performed in accordance with well-established recipes in order to at least remove the layer 222 within the isolation trench 206. In one illustrative embodiment, when other dielectric layers, such as a CMP stop layer formed of silicon nitride, may not be provided at this manufacturing stage, the layer 222 may also be removed from horizontal portions of the semiconductor layer 222. After the removal of the sacrificial layer 222, at least from sidewall portions of the isolation trench 206, the further processing may be continued by depositing a non-oxidizable layer to cover sidewall portions of the isolation trench 206.

Figure 2B:
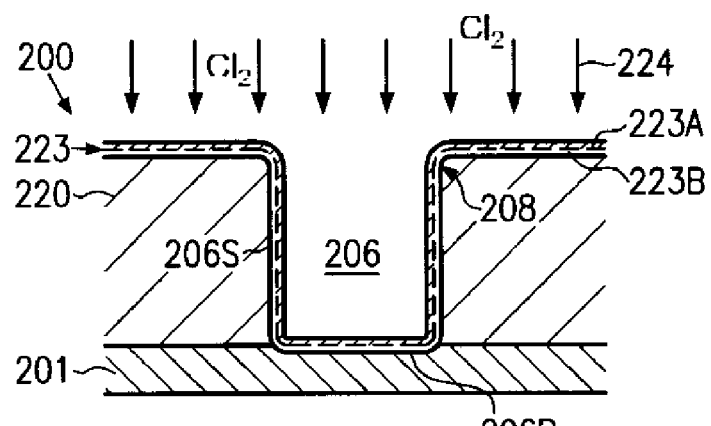

FIG. 2b schematically shows the semiconductor device 200 after the deposition of a non-oxidizable layer 223, which, in one illustrative embodiment, is comprised of silicon nitride, while, in another illustrative embodiment, the layer 223 may be comprised of silicon oxynitride, silicon carbide, nitrogen-enriched silicon carbide and the like. The non-oxidizable layer 223 may be formed on the basis of well-established recipes, wherein, for silicon nitride, well-approved low pressure chemical vapor deposition (LPCVD) recipes may be used in order to form the layer 223 with a high degree of conformity and with a desired thickness, which may, for instance, range from approximately 10-50 nm. It should be appreciated that the layer 223 may be deposited on the basis of process parameters which provide a desired low magnitude of intrinsic stress. For example, silicon nitride may be deposited with low or high compressive or tensile stress, thereby providing the potential for significantly reducing any adverse effects on circuit elements to be formed adjacent to the isolation trench 206.

In one illustrative embodiment, the semiconductor device 200 is subjected to a treatment 224 to modify at least a surface portion 223A of the non-oxidizable layer 223. The modification of the treatment 224 may result in a modified etch behavior of the surface portion 223A compared to a non-modified layer portion 223B with respect to a specified etch recipe. In one illustrative embodiment, the non-oxidizable layer 223 may be comprised of silicon nitride, which may be selectively etched with respect to silicon and silicon dioxide on the basis of well-established wet chemical etch recipes using hot phosphoric acid. In this case, the treatment 224 may modify the surface portion 223A so as to significantly reduce the etch rate for the wet chemical etch process on the basis of hot phosphoric acid, thereby imparting a moderately high etch resistance against hot phosphoric acid to the surface portion 223A. In one embodiment, the treatment 224 may include a chlorine oxidation process at elevated temperatures, for instance in the range of approximately 500-900° C., on the basis of a chlorine-containing ambient, which may also include any inert species, such as noble gases and the like. During the treatment 224, the surface portion 223A may chemically react with the chlorine in the ambient and may therefore receive a modified surface structure, which may then exhibit a significantly increased etch resistance with respect to hot phosphoric acid. The penetration depth of the treatment 224, i.e., a thickness of the surface portion 223A, may be controlled on the basis of process parameters, such as temperature, chlorine contents, treatment duration and the like. For example, appropriate values for the above-specified process parameters may be established on the basis of test runs, in which the removal rate with respect to hot phosphoric acid may be determined for different values of one or more process parameters.

In still another illustrative embodiment, the treatment 224 may be based on a plasma ambient, which may include oxygen so as to provide an oxidizing plasma ambient, in which a certain degree of silicon dioxide may be formed within the surface portion 223A, thereby significantly increasing the etch resistance with respect to hot phosphoric acid. For this purpose, a treatment 224 may be performed in any appropriate deposition or etch tool that is capable of establishing a required plasma ambient. In one illustrative embodiment, the treatment 224, when including a plasma oxidation process, may be performed in a deposition tool suitable for performing plasma-enhanced deposition processes. For example, the layer 223 may be deposited by a plasma-enhanced deposition technique or by a low pressure deposition technique, that is, without providing a plasma ambient, with the required thickness and thereafter an appropriate oxygen-based plasma ambient may be established in order to perform the treatment 224, thereby forming the surface portion 223A. In other illustrative embodiments, the deposition process and the treatment 224 may be performed as separate processes, which may be performed in separate process tools.

Figure 2C:
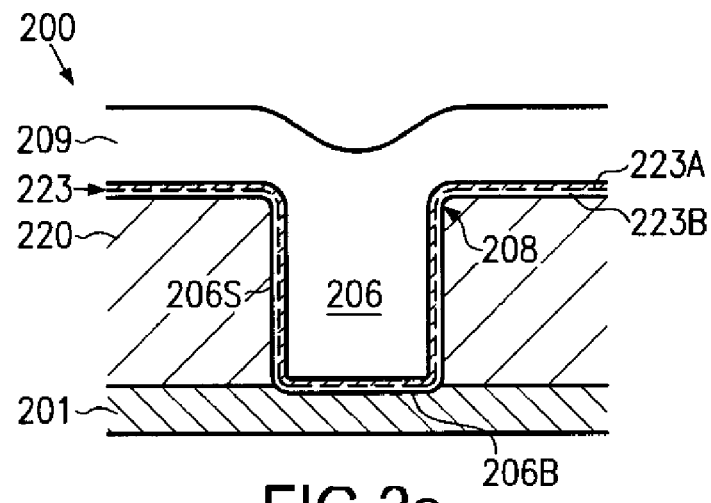

FIG. 2c schematically shows the semiconductor device 200 in a further advanced manufacturing stage. A layer of insulating material 209, which in one illustrative embodiment is an oxide material, such as silicon dioxide, is formed above the layer 223 so as to substantially completely fill the isolation trench 206 such that excess material may be provided above horizontal portions in order to provide reliable filling of the trench 206. The insulating material 209 may be formed in accordance with well-established processes, using for instance TEOS, oxygen and ozone as precursor materials at a temperature range of approximately 350-650° C. In some illustrative embodiments, the insulating material 209 may then be subjected to a heat treatment at elevated temperatures of approximately 700-900° C., thereby efficiently densifying the material 209. The heat treatment for densifying the material 209 may be performed in an inert ambient containing, for instance, nitrogen, hydrogen, helium and the like. In still other illustrative embodiments, a heat treatment for densifying the material 209 may be omitted and the process flow may advance to a process for removing the excess material of the layer 209. During a subsequent removal process, which in one illustrative embodiment comprises a CMP process, the excess material of the layer 209 may be efficiently removed while at the same time the surface topography of the device 200 is planarized. During the CMP process, the layer 223 having the modified surface portion 223A may act as a CMP stop layer due to the increased hardness of the layer 223 compared to the oxide material of the layer 209. Moreover, during the CMP process, the modified surface portion 223A may be at least partially removed, thereby substantially exposing the non-modified portion 223B, which exhibits the substantially non-modified etch behavior with respect to the specified etch recipe, such as a wet chemical etch process on the basis of hot phosphoric acid.

Figure 2D:
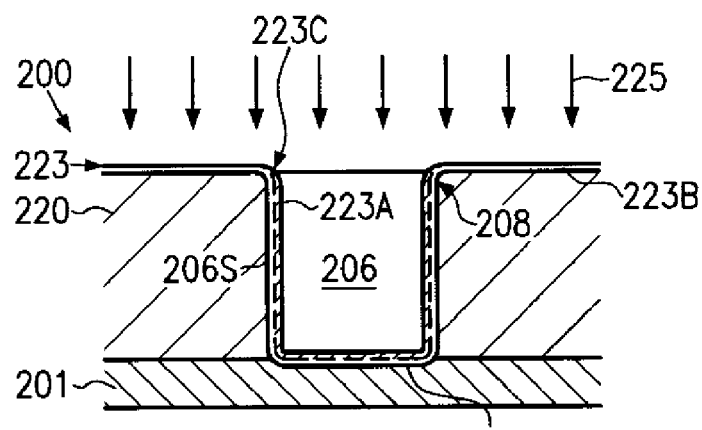

FIG. 2d schematically illustrates the semiconductor device 200 after the completion of the above-described CMP process. Thus, the layer portion 223A is substantially completely removed on horizontal portions, while the modified surface portion 223A is still present within the trench 206 and also at the upper corners or edges 208. It should be appreciated that, in the upper corners or edges 208, an increased amount of surface modification may have taken place due to the increased diffusion area, thereby resulting in a corresponding "corner rounding" at portions 223C so that these portions 223C may exhibit an increased resistance to a chemical treatment 225, which may be a treatment on the basis of hot phosphoric acid in some illustrative embodiments, when the non-oxidizable layer 223 is provided in the form of a silicon nitride layer. Consequently, during the etch attack of the treatment 225, the non-modified portions 223B will be removed highly efficiently and selectively to the underlying material, which may be an oxide layer, if a corresponding deposition regime is used, as will be described with reference to FIG. 3a, or which may be silicon dioxide, when the layer 223 has been deposited without any intermediate buffer layer. By controlling the etch time of the process 225, a certain degree of corner rounding may be adjusted at the portions 223C since a certain material removal may also take place in the modified material 223B, although at a significantly reduced removal rate compared to the non-modified material 223B.

Figure 2E:
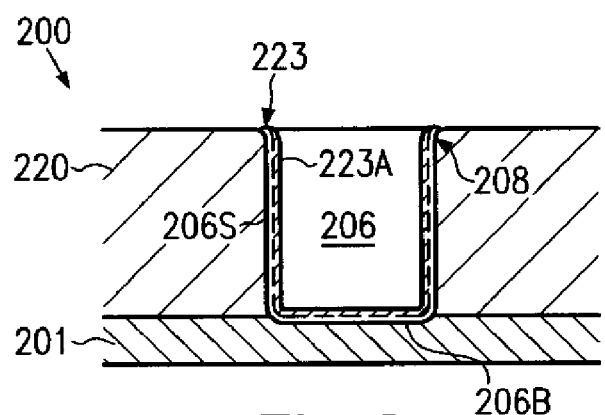

FIG. 2e schematically shows the semiconductor device 200 after the completion of the above-described process flow, wherein the isolation trench 206 is filled with the insulating material of the layer 209 and the liner 223, which may exhibit a significantly reduced compressive stress, irrespective of whether the material 209 may have been densified or not, since the non-oxidizable material 223 may substantially prevent any further oxidation of material adjacent to the trench 206, thereby reducing an increase of volume and thus the creation of compressive stress. Moreover, a desired degree of corner rounding may be achieved at the upper corners 208 and the bottom corners 207 on the basis of the formation of the sacrificial oxide layer 222 while additionally a certain amount of corner rounding may also be achieved at the upper corners 208 on the basis of a control of the etch process 225 as is also described with respect to FIG. 2d. Consequently, circuit elements adjacent to the isolation trench 206 may be formed with less compressive stress, thereby significantly enhancing the device characteristics of, for instance, N-channel field effect transistors, in which undue compressive stress may result in a reduced electron mobility in the respective channel regions.

Figure 3A:
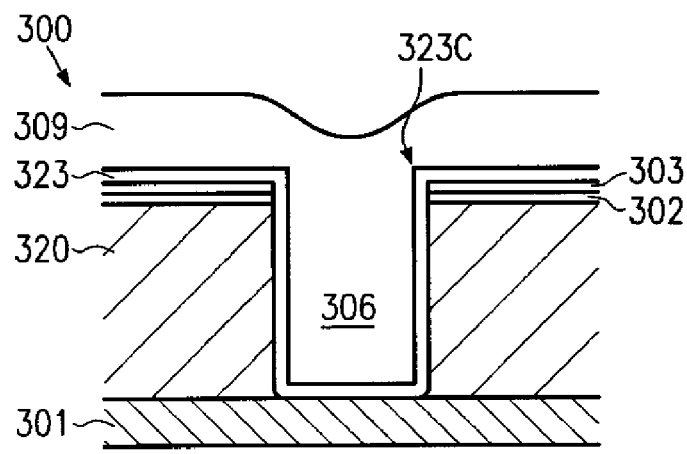
FIGS. 3a-3d schematically show cross-sectional views of an isolation trench with reduced compressive stress formed in accordance with yet other illustrative embodiments of the present invention.

With reference to FIGS. 3a-3d, further illustrative embodiments of the present invention will now be described in more detail. FIG. 3a schematically illustrates a cross-sectional view of a semiconductor device 300 comprising a substrate 301 on which is formed a semiconductor layer 320. Regarding the characteristics of the substrate 301 and the semiconductor layer 320, the same criteria apply as previously explained with reference to the substrates 101, 201 and the semiconductor layer 220. Moreover, the device 300 comprises an isolation trench 306 formed at least in a portion of the semiconductor layer 320, whereas, in some illustrative embodiments, the isolation trench 306 may extend down to a buried insulating layer, when an SOI architecture is provided. Formed on top of the semiconductor layer 320 may be an insulating layer 302 followed by a CMP stop layer 303, which may be comprised of silicon nitride and the like. Moreover, a layer of non-oxidizable material 323 may be formed within the isolation trench 306 and above the layers 302 and 303. Furthermore, an insulating material 309 is formed in the isolation trench 306 and above the layer 323.

A typical process flow for forming the semiconductor device 300 as shown in FIG. 3a may comprise the following processes. After the formation of the layers 302 and 303 on the basis of well-established deposition recipes, as are also described with reference to the device 100, the isolation trench 306 may be formed on the basis of well-established photo-lithography and anisotropic etch techniques, as are also described above with reference to the trenches 106 and 206. Thereafter, in some illustrative embodiments, the device 300 may be subjected to an oxidation process for forming a sacrificial oxide layer within the isolation trench 306, similarly as is described with reference to FIG. 2a, so that a desired degree of corner rounding may be achieved within the isolation trench 306. Thereafter, the sacrificial oxide layer may be removed on the basis of well-established recipes, such as a wet chemical etch process on the basis of hydrofluoric acid. Thereafter, the non-oxidizable layer 323 may be deposited on the basis of well-established recipes, such as low pressure chemical vapor deposition (LPCVD), when, for instance, a silicon nitride layer is to be formed. Regarding any specifics for the deposition process, the same criteria apply as previously explained with reference to the layer 223 (FIG. 2b). It should be appreciated that, in some illustrative embodiments (not shown), the further processing may be continued as is described with reference to FIG. 2b, that is, the layer 323 may be exposed to the treatment 224 in order to modify a significant portion of the layer 323 or the entire layer 323 for endowing the layer 323 with an increased etch resistance against a specified etch recipe. Thereafter, the further processing may be continued as is described with reference to FIGS. 2b and 2c, wherein an even enhanced efficiency and thus reliability of surface modification may be achieved at the upper portion 223C (FIG. 2d), since, based on the device configuration as shown in FIG. 3a, substantially all of the upper portions 323C (FIG. 3b) of the layer 323 may be modified so as to exhibit the enhanced etch resistance, thereby reducing any risk for an undesired removal during a subsequent etch process for removing any residual silicon nitride portions after a preceding CMP process.

In the embodiment shown in FIG. 3a, the non-oxidizable layer 323 may remain untreated at this manufacturing stage and the layer 309 of insulating material, such as silicon dioxide, may be filled in the trench 306, thereby also providing a specific amount of excess material above horizontal portions of the layer 323. Thereafter, the excess material of the layer 309 may be removed on the basis of a CMP process, wherein the layer 323, possibly in combination with the layer 303, may act as a reliable CMP stop layer.

Figure 3B:
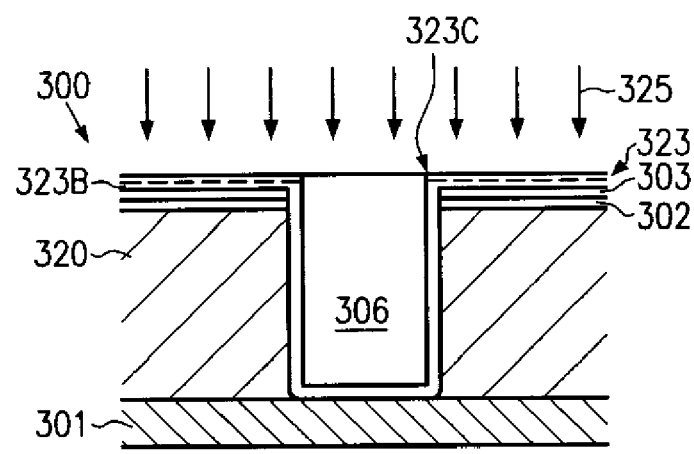

FIG. 3b schematically illustrates the semiconductor device 300 after the completion of the above-described process sequence. Hence, the device comprises a substantially planarized surface topography, wherein a portion of the layer 323 may have been removed to leave a reduced layer portion 322B, whereas, in other illustrative embodiments, the CMP process may have removed substantially all of the layer 323, wherein nevertheless a reliable stop of the CMP process may be guaranteed due to the presence of the underlying layer 303. Thereafter, in one illustrative embodiment, an etch process 325 may be performed, for instance on the basis of hot phosphoric acid, to remove at least a portion of the layer 323B and possibly of the layer 303, wherein, for given process parameters of the etch process 320, for instance for a given temperature and concentration of the hot phosphoric acid, the process time may be controlled to adjust a desired degree of corner rounding at the portions 323C. In other illustrative embodiments, the etch process 325 may be omitted in this manufacturing stage and the device 300 may directly advance to the subsequent manufacturing process.

Figure 3C:
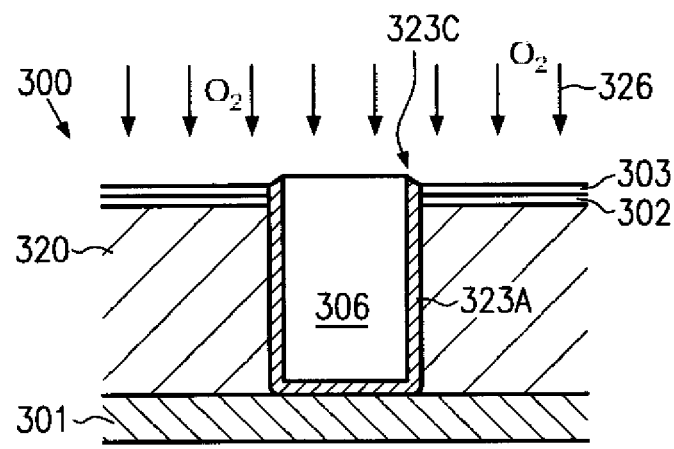

FIG. 3c schematically illustrates the device 300 after the completion of the etch process 325, wherein the layer 323B and a portion of the layer 303 may have been removed during the etch process 325. Moreover, the device 300 is exposed to a high temperature oxidation process 326 in an oxidizing ambient at elevated temperatures in the range of approximately 700-1100° C. During this high temperature oxidation process 326, the material 309 in the isolation trench 306 may be densified, while at the same time a surface modification may take place in the layer 323 that is in contact with the material 309 within the isolation trench 306, which may be caused by an increased oxygen diffusion. Consequently, a significant amount of the layer 323 may be converted into a material 323A having incorporated a significant amount of oxygen, thereby resulting in an enhanced resistance with respect to a wet chemical etch process on the basis of hot phosphoric acid. On the other hand, exposed portions of the remaining layer 303 may not be substantially affected by the oxidizing ambient 326, thereby substantially maintaining their high solubility with respect to hot phosphoric acid.

Figure 3D:
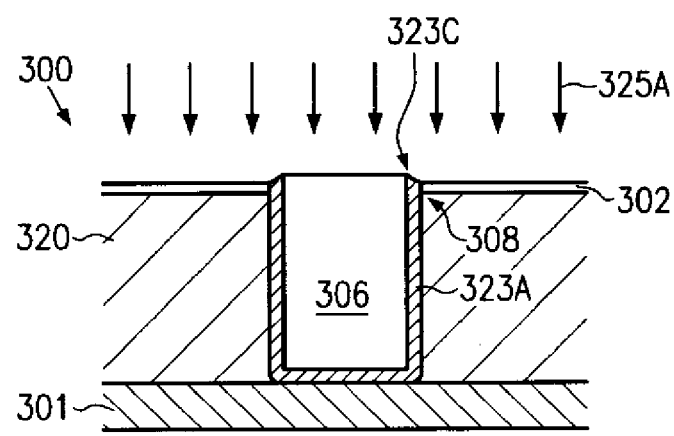

FIG. 3d schematically shows the semiconductor device 300 during an etch process 325A, which may be performed on the basis of hot phosphoric acid, to remove the layer 303 or at least the remaining portions thereof, wherein the modified liner of non-oxidizable material 323A may exhibit an increased etch resistance to substantially avoid any unwanted notches between the material in the isolation trench 306 and the liner 323A. Moreover, based on the etch process 325A, a desired degree of corner rounding at the portions 323C may be achieved, while, on the other hand, a desired degree of corner rounding at the edges 308 and 307, i.e., at the interfaces between the semiconductor layer 320 and the insulating material of the isolation trench 306, may be adjusted on the basis of an oxidation process for forming a sacrificial oxide layer, as is, for instance, explained with reference to FIG. 2a when referring to the sacrificial oxide layer 222. As a consequence, also in the embodiment described with reference to FIGS. 3a-3d, the isolation trench 306 may be formed to exhibit a significantly reduced compressive stress, thereby reducing any deleterious effects on adjacent circuit elements, such as field effect transistors.

As a result, the present invention provides an improved technique for the formation of highly sophisticated isolation trenches in bulk semiconductor substrates or SOI substrates, wherein an enhanced stress and strain engineering may be performed for advanced circuit elements, such as field effect transistors, in that an improved "stress-neutral" behavior of respective isolation structures may be obtained. For this purpose, the isolation trench is provided with a non-oxidizable material, i.e., a material that is non-oxidizable, so that any heat treatments for densification or during later stages of the manufacturing process may not unduly result in increased compressive stress, while, on the other hand, by forming a sacrificial oxide layer after the patterning of the isolation trench and a subsequent removal of the sacrificial layer, an efficient control of corner rounding at the interface between the insulating material and the semiconductor material of the isolation structure may be achieved. Moreover, in some illustrative embodiments, a high degree of compatibility with existing process techniques may be achieved by using well-approved non-oxidizable materials, such as silicon nitride, wherein the etch behavior may be appropriately modified on the basis of a chlorine oxidation, an oxygen-based plasma treatment or a high temperature oxidation process in combination with an oxide material in order to reduce the removal rate for a wet chemical etch process on the basis of hot phosphoric acid. Consequently, the silicon nitride-based liner material in upper corners or edges of the isolation structure may be reliably protected against an etch attack for removing non-modified portions of the remaining silicon nitride layer, which may act as an efficient CMP stop layer in a preceding planarization process. As a result, a high degree of trench integrity may be achieved at the upper corner portions, while the degree of corner rounding at the upper corners may also be adjusted on the basis of an over-etch time during the process for removing the non-modified portions of the CMP stop layer. As previously explained, in some illustrative embodiments, a single silicon nitride layer may be formed after the trench patterning, wherein an upper surface portion thereof may be modified on the basis of one or more of the above-identified process techniques, while, in other illustrative embodiments, a conventional silicon nitride CMP stop layer may be provided prior to or after the trench patterning and subsequently a corresponding liner may be formed, which may be treated on the basis of a chlorine oxidation process or an oxygen plasma treatment, thereby more reliably providing a highly etch-resistant upper corner portion of the silicon nitride layer. In other illustrative embodiments, the liner material in the isolation trench may be selectively modified by means of a high temperature oxidation process after the removal of any excess oxide material, wherein the liner and/or the previously formed silicon nitride stop layer may reliably stop the CMP process. Thereafter, the liner material may be modified to exhibit an increased etch resistance, thereby protecting upper corner portions of the isolation trench during the removal of the remaining CMP stop layer.

A respective process strategy including a high temperature oxidation process may also be applied in the embodiments described with reference to FIGS. 2a-2e wherein, as shown in FIG. 2b, the liner material 223 may be deposited on the basis of well-established recipes substantially without any previous CMP stop layer wherein, however, the corresponding treatment 224 may be omitted and the process sequence may be continued by depositing the material 209 and subsequently planarizing the material without any high temperature densification process. Thereafter, excess material may be removed by chemical mechanical polishing, wherein the layer 223 may act as a CMP stop layer. Thereafter, the high temperature oxidation process may be performed, thereby densifying the material 209 while also providing the liner 223 that is in contact with the material 209 with the increased etch resistance required for the selective removal of non-modified layer portions of the layer 223.

It should be appreciated that at least some of the illustrative embodiments described above may be applied at specific substrate areas, thereby providing the potential for manufacturing isolation trenches having a different degree of stress. For example, in the above-described process strategy referring to a layer modification on the basis of a high temperature oxidation process, the liner 223 (FIG. 2b) or 323 (FIG. 3a) may be removed in selected areas of the substrate 201, 301 prior to filling in the oxide material 209, 309. Consequently, after the filling in of the material 209, 309 and a subsequent high temperature oxidation process in those isolation trenches in which the liner has been removed, a further oxidation of the trench isolation may be performed, thereby intentionally increasing any compressive stress, which may be advantageous for the manufacturing of P-channel field effect transistors in the vicinity of these isolation trenches. On the other hand, for the isolation trenches having the non-oxidizable liner, a significantly reduced compressive stress is obtained, thereby enhancing the performance of, for instance, N-channel field effect transistors formed in the vicinity of these isolation trenches.

Consequently, a high degree of process flexibility is offered by the present invention to provide isolation trenches with reduced compressive stress while at the same time maintaining a high degree of process compatibility with well-established process techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a non-oxidizable layer of material at least on sidewalls of an isolation trench formed in a semiconductor layer located above a substrate;
    modifying at least a surface portion of said non-oxidizable layer of material;
    filling said isolation trench with an insulating material;
    removing excess material of said insulating material to expose at least a first portion of said non-oxidizable layer not modified; and
    subjecting at least the first portion and a second portion of the modified non-oxidizable layer to a common removal process to remove the first portion of said non-oxidizable layer of material, said common removal process being selective relative to said modified surface portion.

2. The method of claim 1, wherein said non-oxidizable layer comprises silicon and nitride.

3. The method of claim 2, wherein forming said non-oxidizable layer comprises depositing a non-oxidizable material above said substrate and modifying at least said surface portion of said non-oxidizable material to reduce an etch rate of said modified surface portion with respect to a specific etch recipe.

4. The method of claim 3, wherein modifying said surface portion comprises exposing said surface portion to an oxidizing ambient comprising chlorine.

5. The method of claim 3, wherein modifying said surface portion comprises exposing said surface portion to an oxidizing plasma ambient.

6. The method of claim 1, further comprising forming a sacrificial thermal oxide layer on sidewall portions of said isolation trench prior to forming said non-oxidizable layer and removing said sacrificial thermal oxide layer by a selective etch process prior to forming said non-oxidizable layer.

7. The method of claim 1, further comprising forming a non-oxidizable stop layer above said substrate prior to forming said isolation trench.

8. The method of claim 7, wherein said non-oxidizable stop layer and said non-oxidizable layer are comprised of substantially the same material.

9. The method of claim 7, further comprising removing said non-oxidizable stop layer by a wet chemical etch process.

10. The method of claim 1, further comprising heat treating said substrate in an inert ambient to densify the insulating material.

11. A method, comprising:
    forming a non-oxidizable layer of material on inner surface portions of an isolation trench formed in a semiconductor layer and above said semiconductor layer;
    filling said isolation trench with an insulating material;
    performing a high temperature oxidation treatment after filling said trench with the insulating material for selectively modifying said non-oxidizable layer of material formed on surface portions of said isolation trench to reduce an etch rate of said modified surface portion with respect to a specific etch recipe; and
    selectively removing non-modified material of said non-oxidizable layer of material by a wet chemical etch process using the specific etch recipe.

12. The method of claim 11, further comprising removing excess material of said insulating material by chemical mechanical polishing while using said non-oxidizable layer outside said isolation trench as a stop layer.

13. The method of claim 12, wherein said non-oxidizable layer comprises at least one of silicon nitride and silicon oxynitride.

14. The method of claim 11, further comprising forming a non-oxidizable stop layer prior to forming said isolation trench.

15. The method of claim 14, wherein said non-oxidizable stop layer and said non-oxidizable layer are comprised of silicon and nitrogen.

16. The method of claim 11, further comprising forming a sacrificial thermal oxide layer on sidewall portions of said isolation trench prior to forming said non-oxidizable layer and removing said sacrificial thermal oxide layer by a selective etch process prior to forming said non-oxidizable layer.

17. A method, comprising,
    forming a non-oxidizable layer of material at least on sidewalls of an isolation trench formed in a semiconductor layer located above a substrate by depositing a non-oxidizable material above said substrate;
    modifying at least a surface portion of said non-oxidizable material to reduce an etch rate of said modified surface portion with respect to a specific etch recipe;
    filling said isolation trench with an insulating material;
    removing excess material of said insulating material; and
    removing a non-modified portion of said non-oxidizable layer of material exposed by removing said excess material of said insulating layer, said step of removing said non-modified portion being selective relative to said modified surface portion.

18. The method of claim 17, wherein modifying said surface portion comprises exposing said surface portion to an oxidizing ambient comprising chlorine.

* * * * *